US008816490B2

(12) United States Patent  (10) Patent No.: US 8,816,490 B2
Foster, Sr. et al.  (45) Date of Patent: *Aug. 26, 2014

(54) INTEGRATED CIRCUIT DIE STACKS WITH ROTATIONALLY SYMMETRIC VIAS

(71) Applicant: International Business Machines Corporation, Armonk, NY (US)

(72) Inventors: Jimmy G. Foster, Sr., Morrisville, NC (US); Kyu-Hyoun Kim, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/847,571

(22) Filed: Mar. 20, 2013

(65) Prior Publication Data

US 2013/0214855 A1    Aug. 22, 2013

Related U.S. Application Data

(63) Continuation of application No. 12/616,563, filed on Nov. 11, 2009, now Pat. No. 8,432,027.

(51) Int. Cl.
*H01L 23/538* (2006.01)
*H01L 23/52* (2006.01)

(52) U.S. Cl.
USPC ............ 257/686; 257/774; 257/E23.011; 257/E23.174; 438/667

(58) Field of Classification Search
USPC .......................................... 438/667
See application file for complete search history.

(56) References Cited

U.S. PATENT DOCUMENTS

| 4,733,461 | A  | 3/1988 | Nakano |
| 5,963,464 | A  | 10/1999 | Dell et al. |
| 5,967,799 | A  | 10/1999 | Arai |
| 6,913,471 | B2 | 7/2005 | Smith |
| 2004/0232559 | A1 | 11/2004 | Adelmann |
| 2007/0096332 | A1 | 5/2007 | Satoh et al. |
| 2007/0117348 | A1 | 5/2007 | Ramanathan et al. |
| 2011/0109381 | A1 | 5/2011 | Foster, Sr. et al. |

FOREIGN PATENT DOCUMENTS

EP      00213205 A1    11/1987

OTHER PUBLICATIONS

Office Action, U.S. Appl. No. 12/616,563, Aug. 6, 2012, pp. 1-24.
Notice of Allowance, U.S. Appl. No. 12/616,563, Dec. 26, 2012, pp. 1-9.

*Primary Examiner* — Matthew W Such
*Assistant Examiner* — Scott Stowe
(74) *Attorney, Agent, or Firm* — Brandon C. Kennedy; Katherine S. Brown; Biggers Kennedy Lenart Spraggins LLP

(57) ABSTRACT

An integrated circuit die stack including a first integrated circuit die mounted upon a substrate, the first die including pass-through vias ('PTVs') composed of conductive pathways through the first die with no connection to any circuitry on the first die; and a second integrated circuit die, identical to the first die, rotated with respect to the first die and mounted upon the first die, with the PTVs in the first die connecting signal lines from the substrate through the first die to through silicon vias ('TSVs') in the second die composed of conductive pathways through the second die connected to electronic circuitry on the second die; with the TSVs and PTVs disposed upon each identical die so that the positions of the TSVs and PTVs on each identical die are rotationally symmetrical with respect to the TSVs and PTVs on the other identical die.

18 Claims, 13 Drawing Sheets

Transmit An Alternating Current Signal From A Substrate  302

Transmit The Signal Through A First Substack Mounted Upon The Substrate To Electronic Circuitry In A Second Substack In The Die Stack, The First Substack Composed Of Two Or More Identical Dies , Each Of The Dies In The First Substack Stacked Upon One Another Without Rotation With Respect To One Another, The Second Substack Composed Of Two Or More Dies Identical To The Dies In The First Substack, Each Of The Dies In The Second Substack Stacked Upon One Another Without Rotation With Respect To One Another, The Entire Second Substack Rotated With Respect To The First Substack And Mounted Upon The First Substack So That PTVs In The First Substack Connect The Signal Lines From The Substrate Through The First Substack To TSVs In The Second Substack
314

Conduct The Signal Through PTVs  304

Conduct The Signal Through PTVs In The First Substack, The PTVs Composed Of Conductive Pathways Through The First Substack With No Connection To Any Circuitry In The First Substack
316

Conduct The Signal Through TSVs To The Electronic Circuitry  306

Conduct The Signal Through TSVs In The Second Substack To Electronic Circuitry In The Second Substack, TSVs In The Second Substack Comprising Conductive Pathways Through The Second Substack That Are Also Connected To Electronic Circuitry In The Second Substack
318

INTEGRATED CIRCUIT DIE STACKS WITH ROTATIONALLY SYMMETRIC VIAS

CROSS-REFERENCE TO RELATED APPLICATION

This application is a continuation application of and claims priority from U.S. patent application Ser. No. 12/616,563, filed on Nov. 11, 2009.

BACKGROUND OF THE INVENTION

1. Field of the Invention

The field of the invention is design, fabrication, and operation of integrated circuit, or, more specifically, structure and methods of making and operating integrated circuit die stacks with rotationally symmetric vias.

2. Description Of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

One of the areas of computer technology that sees continual advancement is packaging of integrated circuits. Packaging many integrated circuits into a confined space is becoming more difficult as many devices continue to shrink in size or need to communicate with more chips. An example would be stacking multiple memory chips in one package to provide more locations to store data. Prior art has shown how to stack multiple chips on top of each other with package stacking, one die per package. Other prior art has shown how to stack multiple dies into one package by tying signal lines together between or among dies within the package, for example, wrapping signal lines outside the dies, or placing redistribution layers between the dies. A more recent approach for wafer stacking is to connect the signals together with vias, effectively sending a bus of signal lines vertically through a stack of dies. All of these approaches have the drawback of more heavily loading busses as more dies are stacked reducing signal quality and bus speeds.

SUMMARY OF THE INVENTION

An integrated circuit die stack, including methods of making and operating, including a first integrated circuit die mounted upon a substrate, the first die including pass-through vias ('PTVs'), each PTV composed of a conductive pathway through the first die with no connection to any circuitry on the first die; and a second integrated circuit die, identical to the first die, rotated with respect to the first die and mounted upon the first die, with the PTVs in the first die connecting signal lines from the substrate through the first die to through silicon vias ('TSVs') in the second die, each TSV on the second die composed of a conductive pathway through the second die that is also connected to electronic circuitry on the second die; with the TSVs and PTVs disposed upon each identical die so that the positions of the TSVs and PTVs on each identical die are rotationally symmetrical with respect to the TSVs and PTVs on the other identical die.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIGS. 12-13 set forth flow charts illustrating example methods of operation for an integrated circuit die stack according to embodiments of the present invention.

DETAILED DESCRIPTION OF EXAMPLE EMBODIMENTS

Figure 1:
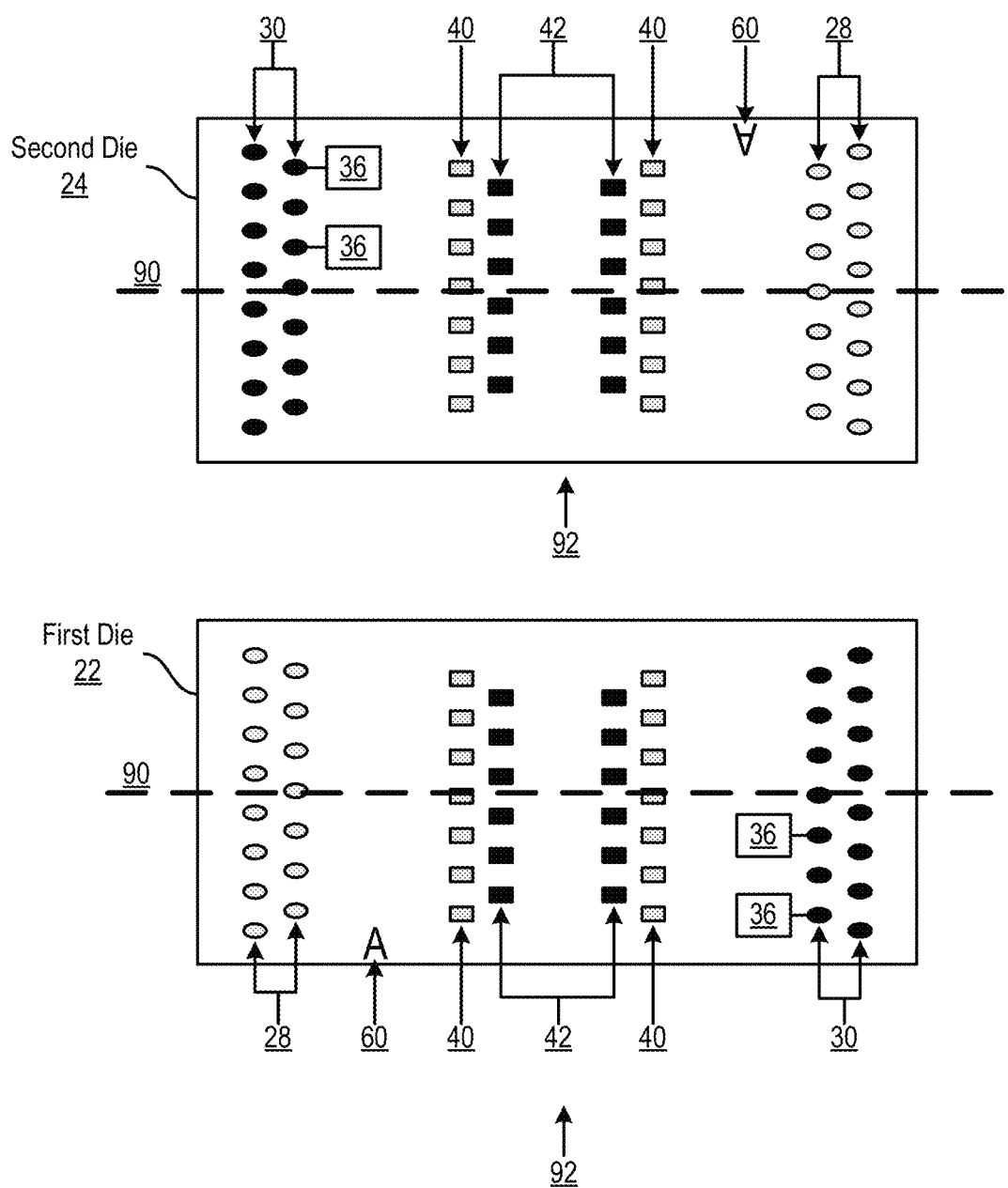
FIG. 1 sets forth a cross-sectional plan view schematic drawing of two example integrated circuit dies of a die stack according to embodiments of the present invention.

Examples of integrated circuit die stacks, methods of manufacturing integrated circuit die stacks, and methods of operation for integrated die stacks according to embodiments of the present invention are described with reference to the accompanying drawings, beginning with FIG. 1. FIG. 1 sets forth a cross-sectional plan view schematic drawing of two example integrated circuit dies of a die stack according to embodiments of the present invention, a die stack that includes two dies, a first die (22) and a second die (24). A die stack is formed of these two dies by mounting the second die on the first die and then mounting the two dies onto a substrate. The substrate can be a connective layer in a chip package between the die stack and external pins or between flip-chip connectors and the stack. In other embodiments the substrate can be a board, an integrated circuit carrier board, an adapter board, or a motherboard, for example.

Each die in this example includes pass-through vias ('PTVs') (28), conductive pathways through each die with no connections to any circuitry on the die. Each die also includes through silicon vias ('TSVs') (30), conductive pathways through the dies that also connect to electronic circuitry (36) on the die. For ease of explanation, FIG. 1 shows only a couple of instances of circuitry (36), but as a practical matter, in many if not most actual embodiments, most or all of the TSVs would drive circuitry on a die, forming in effect a connection for a bus, for signals from the bus driven to the circuitry on a die.

The second die is identical to the first die, although in the illustration, the second die is rotated 180 degrees in the horizontal plane with respect to the first die. The TSVs and PTVs are disposed upon each identical die so that the positions of the TSVs and PTVs on each identical die are rotationally symmetrical with respect to the TSVs and PTVs on the other identical die. "Rotationally symmetrical" means that the TSVs and PTVs on each identical die align when one die is rotated in a same plane with respect to the other identical die. In this example, the angle through which the second die rotates with respect to the first die in order to align the TSVs and the PTVs on the dies is 180 degrees. Other angles for rotational symmetry are possible, and some of them are described below. That the second die is rotated 180 degrees with respect to the first die is evidenced by the first die's PTVs (28) on the left side of the drawing with the second die's PTVs (28) on the right, the first die's TSVs (30) on the right side of the drawing with the second die's TSVs (28) on the left, and the letter 'A' (60), provided for the particular purpose of showing die orientation, upright on the bottom left of the first die and inverted on the top right of the second die. When the second die is rotated with respect to the first die and mounted upon the first die, the PTVs (28) in the first die connect signal lines from a substrate through the first die (22) to the TSVs (30) in the second die, and the TSVs (30) on the second die (24) represent conductive pathways through the second die that are also connected to electronic circuitry (36) on the second die.

Both dies also include power lines (40) and common lines (42), which like the PTVs and the TSVs are also conductive pathways through the dies. In addition, the power lines and common lines, also like the PTVs and TSVs, are disposed on both dies so as to be rotationally symmetrical. "Rotationally symmetrical," however, has a slightly different meaning in the case of the power and common lines. "Rotationally symmetrical" as applied to the TSVs and PTVs means that upon rotation of a die, the TSVs on that die align with PTVs on another die. More particularly, the PTVs do not align with PTVs, and the TSVs do not align with TSVs. In the case of the power and common lines, it is not intended to align power lines with common lines. On the contrary, it is intended to align power lines and power lines, common lines and common lines. So in the case of the power lines and common lines, "rotationally symmetrical" means that upon rotation the power lines (40) on the rotated die (24) align with power lines (40) on the other die (22), and the common lines (42) on the rotated die (24) align with common lines (42) on the other die (22).

Figure 2:
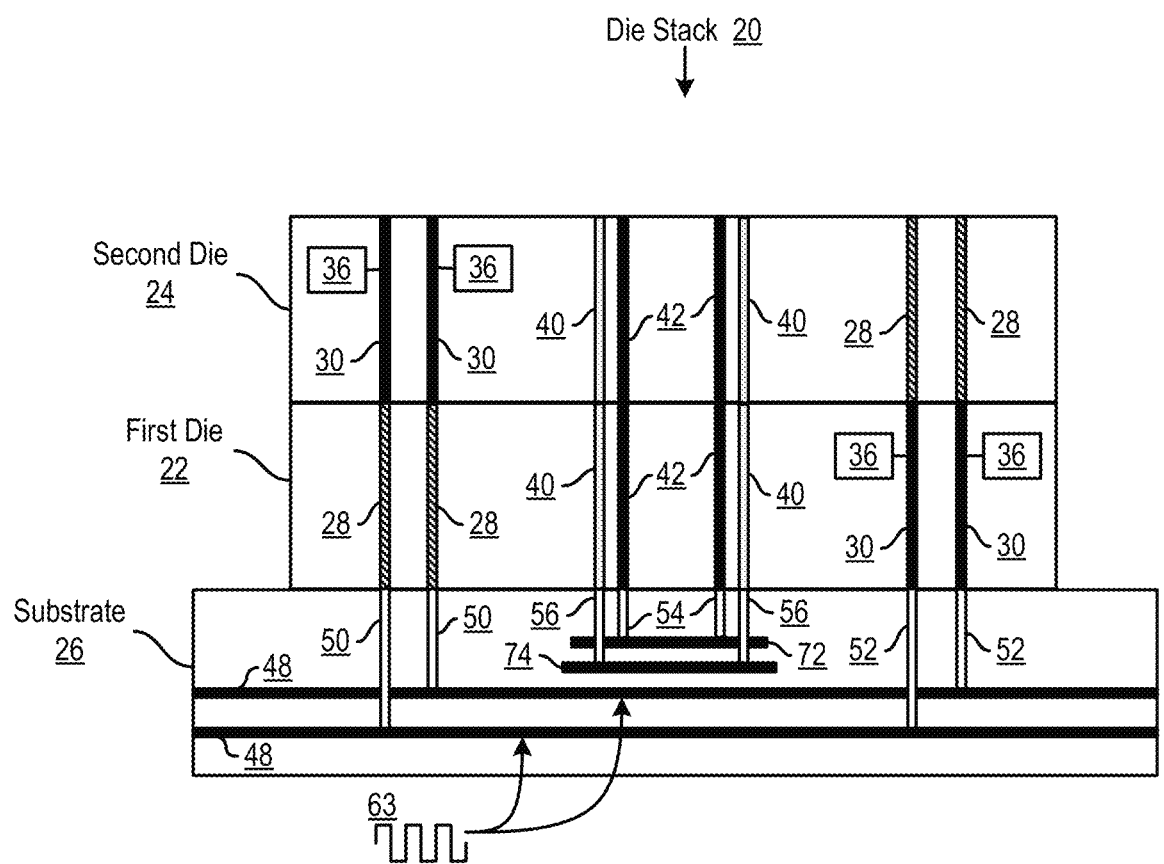
FIG. 2 sets forth a cross-sectional vertical view schematic drawing of an example integrated circuit die stack according to embodiments of the present invention.

For further explanation, FIG. 2 sets forth a cross-sectional vertical view schematic drawing of an example integrated circuit die stack according to embodiments of the present invention. FIG. 2 shows the dies (22, 24) of FIG. 1 stacked upon a substrate (26)—with the cross-section of FIG. 2 taken along lines (90) on FIG. 1 and viewed from perspective (92) on FIG. 1. The substrate provides signal lines (48), illustrated here for ease of explanation as in effect a two-line bus, although readers will recognize that such signal buses will often contain eight lines, sixteen lines, thirty-two lines, and so on. The substrate also provides connections (50, 52) from the signal lines (48) in the substrate through TSVs (30) to circuitry (36) on the dies. Readers will recognize that, as an alternative to the single bus (48) substrate architecture of FIG. 2, the substrate (26) could implement two buses, one to drive connections (50) and another separate set of bus conductors to drive connections (52). The architecture as illustrated presents an engineering challenge to impedance-match a single bus (48) to drive two sets of conductors (50, 52) up into the die stack. A two-bus architecture would ease the impedance matching challenge while at the same time requiring more complexity in the substrate. The substrate as illustrated in this example connects to the TSVs (30) in the second die (24) through PTVs (28) in the first die (22), and each die (22, 24) in this example includes PTVs (28), conductive pathways through each die with no connections to any circuitry on the die. Each die also includes TSVs (30), again, conductive pathways through the dies that also connect to electronic circuitry (36) on a die.

The second die is identical to the first die, although in the illustration, the second die is rotated 180 degrees in the horizontal plane with respect to the first die. The TSVs and PTVs are disposed upon each identical die so that the positions of the TSVs and PTVs on each identical die are rotationally symmetrical with respect to the TSVs and PTVs on the other identical die. "Rotationally symmetrical" again means that the TSVs and PTVs on each identical die align when one die is rotated in a same plane with respect to the other identical die. In this example, the angle through which the second die rotates with respect to the first die in order to align the TSVs and the PTVs on the dies is 180 degrees. Other angles for rotational symmetry are possible, and some of them are described below. That the second die is rotated 180 degrees with respect to the first die is evidenced by the first die's PTVs (28) on the left side of the drawing with the second die's PTVs (28) on the right, and the first die's TSVs (30) on the right side of the drawing with the second die's TSVs (28) on the left. When the second die is rotated with respect to the first die and mounted upon the first die, the PTVs (28) in the first die connect signal lines from the substrate through the first die (22) to the TSVs (30) in the second die, and the TSVs (30) on the second die (24) represent conductive pathways through the second die that are also connected to electronic circuitry (36) on the second die.

Both dies also include power lines (40) and common lines (42), which like the PTVs and the TSVs are also conductive pathways through the dies. In addition, the power lines and common lines, also like the PTVs and TSVs, are disposed on both dies so as to be rotationally symmetrical. As explained earlier, "rotationally symmetrical," has a slightly different meaning in the case of the power and common lines. "Rotationally symmetrical" as applied to the TSVs and PTVs means that upon rotation of a die, the TSVs on that die align with PTVs on another die. More particularly, the PTVs do not align with PTVs, and the TSVs do not align with TSVs. In the case of the power and common lines, it is not intended to align power lines with common lines. On the contrary, it is intended to align power lines and power lines, common lines and common lines. So in the case of the power lines and common lines, "rotationally symmetrical" means that upon rotation the power lines (40) on the rotated die (24) align with power lines (40) on the other die (22), and the common lines (42) on the rotated die (24) align with common lines (42) on the other die (22).

Figure 3:
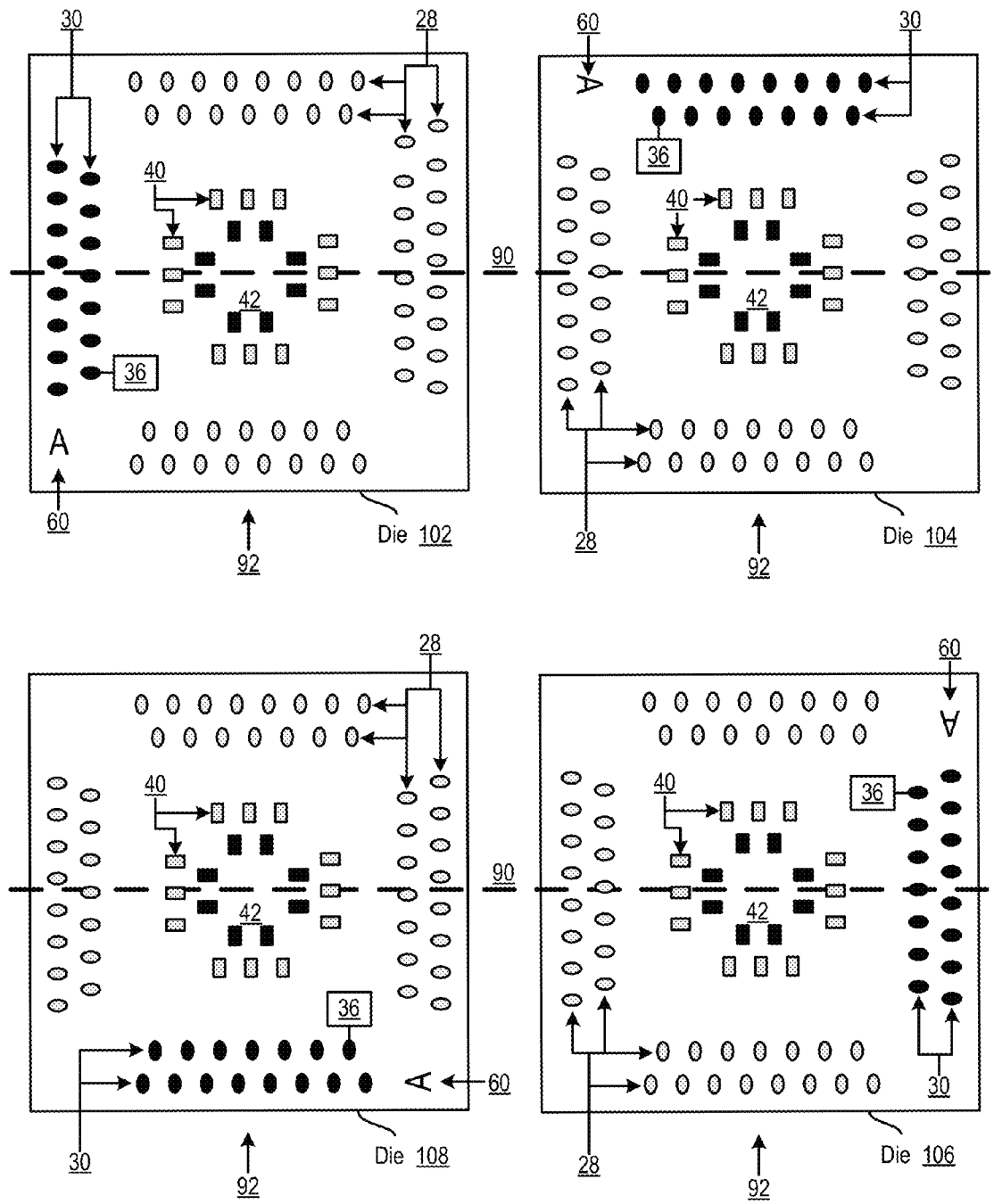
FIG. 3 sets forth a cross-sectional plan view schematic drawing of four example integrated circuit dies of a die stack according to embodiments of the present invention.

For further explanation, FIG. 3 sets forth a cross-sectional plan view schematic drawing of four example integrated circuit dies (102, 104, 106, 108) of a die stack according to embodiments of the present invention. For ease of explanation, the die stack of FIG. 3 has been unstacked into a plan view of the four dies. The dies of FIG. 3 are similar to the dies of FIGS. 1-2, because each die in the example of FIG. 3 includes PTVs (28), TSVs (30), power lines (40), and common lines (42). Again, FIG. 3 shows only a couple of instances of circuitry (36) connected to TSVs, but, as noted earlier, as a practical matter, all TSVs would typically drive circuitry on a die.

All four dies in the example of FIG. 3 are identical, although they are illustrated with rotations with respect to one another, and the TSVs (30) and PTVs (28) are disposed upon each identical die so that the positions of the TSVs and PTVs on each identical die are rotationally symmetrical with respect to the TSVs and PTVs on the other identical die. In the example of FIG. 3, unlike the example dies in the examples of FIGS. 1-2, the angle of rotation for rotational symmetry is 90 degrees instead of 180. That is, the TSVs and PTVs are disposed upon each identical die so that TSVs align with PTVs when one die is rotated 90 degrees in a same plane with respect to any other identical die. The positions of the power lines (40) and common lines (42) are also rotationally symmetrical—in the sense that when rotated power lines align with power lines and common lines align with common lines.

Taking die (102) as a first die to be mounted directly on a substrate, the other dies in FIG. 3 can be formed into a die stack by rotating die (104) 90 degrees (as actually shown here) and stacking it onto die (102). Then die (106), rotated as shown here 90 degrees with respect to die (104), 180 degrees with respect to die (102) is stacked onto die (104), and die (108), rotated as shown here 90 degrees with respect to die (106), 180 degrees with respect to die (104), and 270 degrees with respect to die (102), is stacked onto die (106) to complete a 4-die stack. In a fashion similar to that used above with regard to FIG. 1, successive 90 degree rotations are illustrated by the movement of the TSVs (30) from the left side of die (102) to the top of die (104), the right side of die (106), and the bottom of die (108), along with the illustrative emblem "A" (60) moving from the bottom left of die (102), as the dies are rotated through respective angles of 90 degrees each, to the top left of die (104), top right of die (106), and bottom right of die (108). Each such rotation and stacking of a die aligns TSVs (30) in the rotated die with PTVs (28) in the die upon which the rotated die is stacked, so that signal lines from a substrate can be connected through the PTVs to the TSVs.

Figure 4:
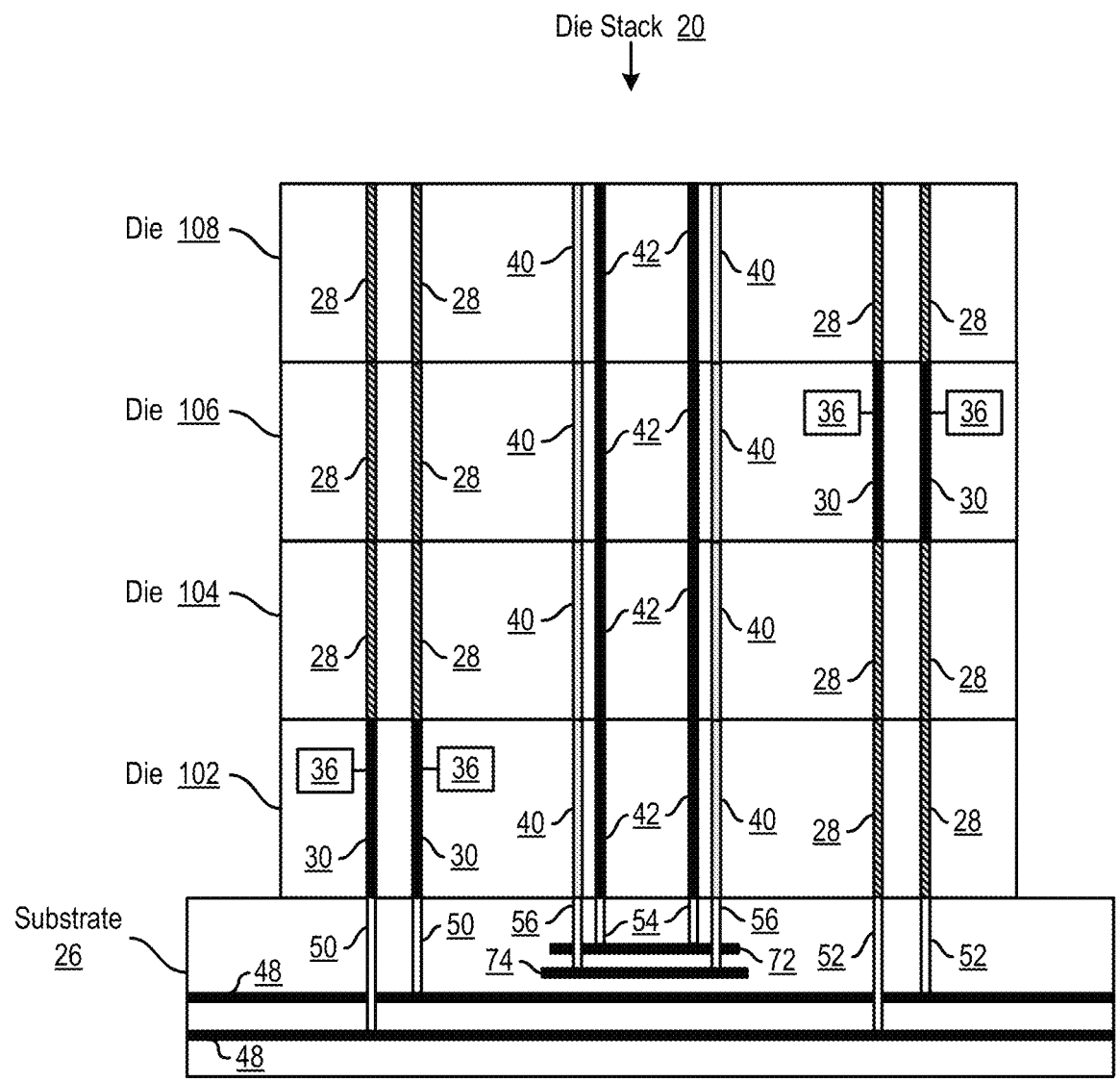
FIG. 4 sets forth a cross-sectional vertical view schematic drawing of a further example integrated circuit die stack according to embodiments of the present invention.

For further explanation, FIG. 4 sets forth a cross-sectional vertical view schematic drawing of a further example integrated circuit die stack according to embodiments of the present invention. FIG. 4 illustrates the four dies (102, 104, 106, 108) of FIG. 3 actually stacked upon a substrate (26)—instead of unstacked as they were shown in FIG. 3. The cross-section of FIG. 4 is taken along lines (90) on FIG. 3 and viewed from perspective (92) on FIG. 3. The substrate provides signal lines (48), illustrated here for ease of explanation as in effect a two-line bus, although readers will recognize that such signal buses will often contain eight lines, sixteen lines, thirty-two lines, and so on. The substrate also provides connections (50, 52) from the signal lines (48) in the substrate through TSVs (30) to circuitry (36) on the dies. Readers will recognize that, as an alternative to the single bus (48) substrate architecture of FIG. 4, which actually is driving four sets of conductors up into the die stack (28, 30 on FIG. 3), the substrate (26) could implement four separate buses. The architecture as illustrated presents an engineering challenge to impedance-match a single bus (48) to drive four sets of bus conductors up into the die stack. A four-bus architecture would ease the impedance matching challenge while at the same time requiring more complexity in the substrate.

As shown in the example of FIG. 4, the substrate's signal lines connect to the TSVs (30) in dies (104, 106, 108) through PTVs (28) in the lower dies—although given the location of the cross-section and the perspective from which the cross section is viewed, only the drawing of the circuitry (36) in die (106) is visibly connected through PTVs, that is, PTVs (28) on the right sides of dies (102, 104). Each die in this example includes PTVs (28), conductive pathways through each die with no connections to any circuitry on the die. Each die also includes TSVs (30), again, conductive pathways through the dies that also connect to electronic circuitry (36) on a die.

All four dies in the example of FIG. 4 are identical, although they are illustrated with rotations with respect to one another, and the TSVs (30) and PTVs (28) are disposed upon each identical die so that the positions of the TSVs and PTVs on each identical die are rotationally symmetrical with respect to the TSVs and PTVs on the other identical die. In the example of FIG. 4, unlike the example dies in the examples of FIGS. 1-2, the angle of rotation for rotational symmetry is 90 degrees instead of 180. That is, the TSVs and PTVs are disposed upon each identical die so that TSVs align with PTVs when one die is rotated 90 degrees in a same plane with respect to any other identical die. The positions of the power lines (40) and common lines (42) are also rotationally symmetrical—in the sense that when rotated power lines align with power lines and common lines align with common lines.

With die (102) representing a first die mounted directly on the substrate (26), the other dies in FIG. 4 are formed into a die stack by rotating die (104) 90 degrees with respect to die (102) and then stacking die (104) onto die (102), rotating die (106) 90 degrees with respect to die (104) and stacking die (106) onto die (104), and rotating die (108) 90 degrees with respect to die (106) and stacking die (108) onto die (106). In a fashion similar to that described above with regard to FIG. 3, successive 90 degree rotations are illustrated by the movement of the TSVs (30) from the left side of die (102) to the back of die (104) where they are not visible on FIG. 4, to the right side of die (106) where they are visible on FIG. 4, and to the front of die (108), where again they are not visible on FIG. 4 because of the location of the cross-section and the perspective. Each such rotation and stacking of a die aligns TSVs (30) in the rotated die with PTVs (28) in the die upon which the rotated die is stacked, so that signal lines (48) from the substrate (26) can be connected through PTVs (28) to the TSVs (30)—a fact illustrated here by the PTVs (28) in dies (102, 104) connecting signal lines (48) through TSVs (30) in die (106) to circuitry (36) in die (106). The same kind of connection is present in all the dies of FIG. 4 except for die (102); die (102) does not need connection through a PTV in another die because die (102) is installed directly onto the substrate (30) and so has a direct connection from its TSVs (30) to the signal lines (48) in the substrate.

Figure 5:
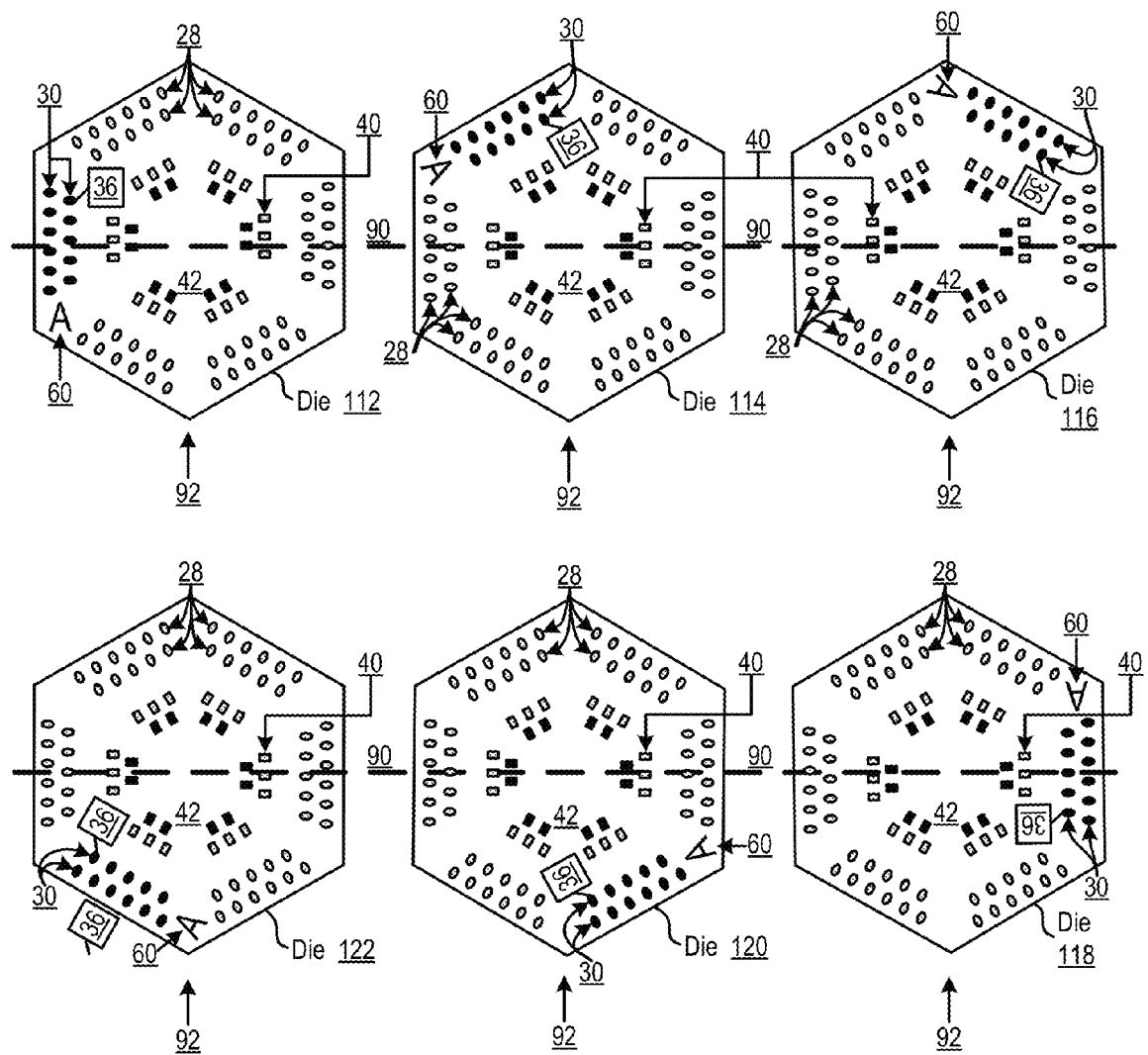
FIG. 5 sets forth a cross-sectional plan view schematic drawing of six example integrated circuit dies of a die stack according to embodiments of the present invention.

For further explanation, FIG. 5 sets forth a cross-sectional plan view schematic drawing of six example integrated circuit dies (112, 114, 116, 118, 120, 122) of a die stack according to embodiments of the present invention. For ease of explanation, the die stack of FIG. 5 has been unstacked into a plan view of the six dies. The dies of FIG. 5 are similar to the dies of FIGS. 1-4, because each die in the example of FIG. 5 includes PTVs (28), TSVs (30), power lines (40), and common lines (42). Again, FIG. 5 shows only a few of instances of circuitry (36) connected to TSVs, but, as noted earlier, as a practical matter, all TSVs would typically drive circuitry on a die.

All six dies in the example of FIG. 3 are identical, although they are illustrated with rotations with respect to one another, and the TSVs (30) and PTVs (28) are disposed upon each identical die so that the positions of the TSVs and PTVs on each identical die are rotationally symmetrical with respect to the TSVs and PTVs on the other identical die. In the example of FIG. 3, unlike the example dies in the examples of FIGS. 1-4, the angle of rotation for rotational symmetry is 60 degrees instead of 180 or 90. That is, the TSVs and PTVs are disposed upon each identical die so that TSVs align with PTVs when one die is rotated 60 degrees in a same plane with respect to any other identical die. The positions of the power lines (40) and common lines (42) are also rotationally symmetrical—in the sense that when rotated power lines align with power lines and common lines align with common lines.

Taking die (112) as a first die to be mounted directly on a substrate, the other dies in FIG. 5 can be formed into a die stack by rotating die (114) 60 degrees (as actually shown here) and stacking it onto die (112). Then die (116), rotated as shown here 60 degrees with respect to die (114), 120 degrees with respect to die (112), is stacked onto die (114), and die (118), rotated as shown here 60 degrees with respect to die (116), 120 degrees with respect to die (114), and 180 degrees with respect to die (112), is stacked onto die (116). Die (120) is rotated an additional 60 degrees with respect to die (118), and die (122) is rotated a still further 60 degrees with respect to die (120) to complete a six die stack. In a fashion similar to that used above with regard to FIGS. 1 and 3, successive 60 degree rotations are illustrated by the movement of the TSVs (30) from the left side of die (112) to the top left of die (114), the top right side of die (116), to the right side of die (118), the bottom right of die (120), and the bottom left of die (122), along with the illustrative emblem "A" (60) moving from the bottom left of die (112), as the dies are rotated through respective angles of 60 degrees each, to the top left of die (114), top of die (116), top right of die (118), bottom right of die (120), and bottom of die (122). Each such rotation and stacking of a die aligns TSVs (30) in the rotated die with PTVs (28) in the die upon which the rotated die is stacked, so that signal lines from a substrate can be connected through the PTVs to the TSVs and then to circuitry on each die.

Figure 6:
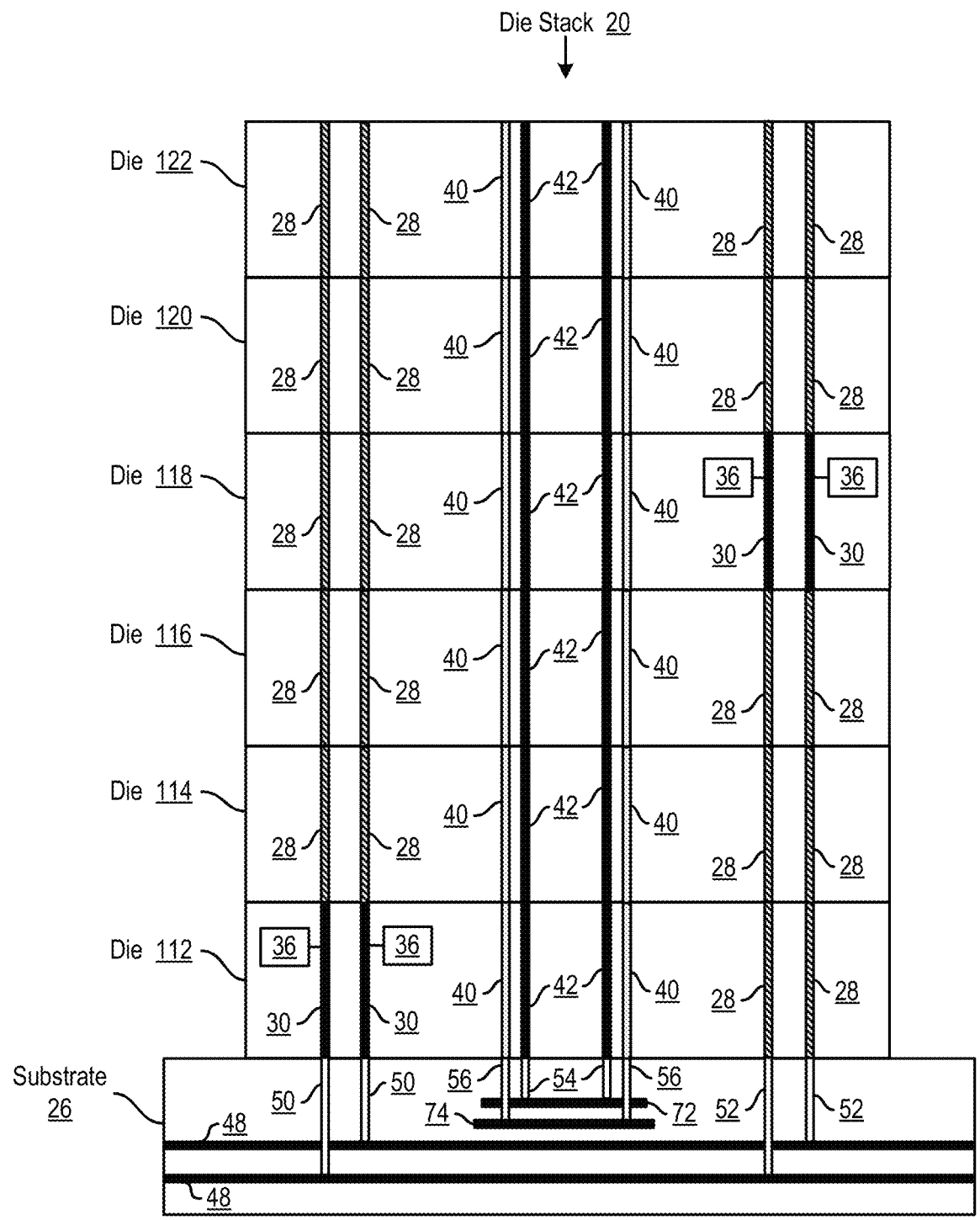
FIG. 6 sets forth a cross-sectional vertical view schematic drawing of a further example integrated circuit die stack according to embodiments of the present invention.

For further explanation, FIG. 6 sets forth a cross-sectional vertical view schematic drawing of a further example integrated circuit die stack according to embodiments of the present invention. FIG. 6 illustrates the six dies (112, 114, 116, 118, 120, 122) of FIG. 5 actually stacked upon a substrate (26)—instead of unstacked as they were shown in FIG. 5. The cross-section of FIG. 6 is taken along lines (90) on FIG. 5 and viewed from perspective (92) on FIG. 5. The substrate provides signal lines (48), illustrated here for ease of explanation as in effect a two-line bus, although readers will recognize that such signal buses will often contain eight lines, sixteen lines, thirty-two lines, and so on. The substrate also provides connections (50, 52) from the signal lines (48) in the substrate through TSVs (30) to circuitry (36) on the dies. Readers will recognize that, as an alternative to the single bus (48) substrate architecture of FIG. 6, which actually is driving six sets of conductors up into the die stack (28, 30 on FIG. 5), the substrate (26) could implement six separate buses. The architecture as illustrated presents an engineering challenge to impedance-match a single bus (48) to drive six sets of bus conductors up into the die stack. A six-bus architecture would ease the impedance matching challenge while at the same time requiring more complexity in the substrate.

In example of FIG. 6 as illustrated here, the substrate's signal lines connect to the TSVs (30) in dies (114, 116, 118, 120, 122) through PTVs (28) in the lower dies—although given the location of the cross-section and the perspective from which the cross section is viewed, only the drawing of the circuitry (36) in die (118) is visibly connected through PTVs, that is, PTVs (28) on the right sides of dies (112, 114, 116). Each die in this example includes PTVs (28), conductive pathways through each die with no connections to any circuitry on the die. Each die also includes TSVs (30), again, conductive pathways through the dies that also connect to electronic circuitry (36) on a die.

All six dies in the example of FIG. 6 are identical, although they are illustrated with rotations with respect to one another, and the TSVs (30) and PTVs (28) are disposed upon each identical die so that the positions of the TSVs and PTVs on each identical die are rotationally symmetrical with respect to the TSVs and PTVs on the other identical die. In the example of FIG. 6, unlike the example dies in the examples of FIGS. 1-4, the angle of rotation for rotational symmetry is 60 degrees instead of 90 or 180. That is, the TSVs and PTVs are disposed upon each identical die so that TSVs align with PTVs when one die is rotated 60 degrees in a same plane with respect to any other identical die. The positions of the power lines (40) and common lines (42) are also rotationally symmetrical—in the sense that when rotated power lines align with power lines and common lines align with common lines.

With die (112) representing a first die mounted directly on the substrate (26), the other dies in FIG. 6 are formed into a die stack by rotating die (114) 60 degrees horizontally with respect to die (112) and then stacking die (114) onto die (112), rotating die (116) 60 degrees with respect to die (114) and stacking die (116) onto die (114), rotating die (118) 60 degrees with respect to die (116) and stacking die (118) onto die (116), rotating die (120) 60 degrees with respect to die (118) and stacking die (120) onto die (118), and rotating die (122) 60 degrees with respect to die (120) and stacking die (122) onto die (120). In a fashion similar to that described above with regard to FIG. 5, successive 60 degree rotations are illustrated by the movement of the TSVs (30) from the left side of die (112) to the back left of die (114) where they are not visible on FIG. 6, to the back right side of die (116) where they are not visible on FIG. 6, to the right side of die (118) where they are visible on FIG. 6, to the front right of die (120) where they are not visible on FIG. 6, and finally to the front left of die (122) where again they are not visible on FIG. 6 because of the location of the cross-section and the perspective in which the cross-section is viewed in FIG. 6. Each such rotation and stacking of a die aligns TSVs (30) in the rotated die with PTVs (28) in the die upon which the rotated die is stacked, so that signal lines (48) from the substrate (26) can be connected through PTVs (28) to the TSVs (30)—a fact illustrated here by the PTVs (28) on the right side of dies (112, 114, 116) connecting signal lines (48) through TSVs (30) in die (118) to circuitry (36) in die (118). The same kind of connection is present in all the dies of FIG. 6 except for die (112); die (112) does not need connection through a PTV in another die because die (112) is installed directly onto the substrate (30) and so has a direct connection from its TSVs (30) to the signal lines (48) in the substrate.

Figure 7:
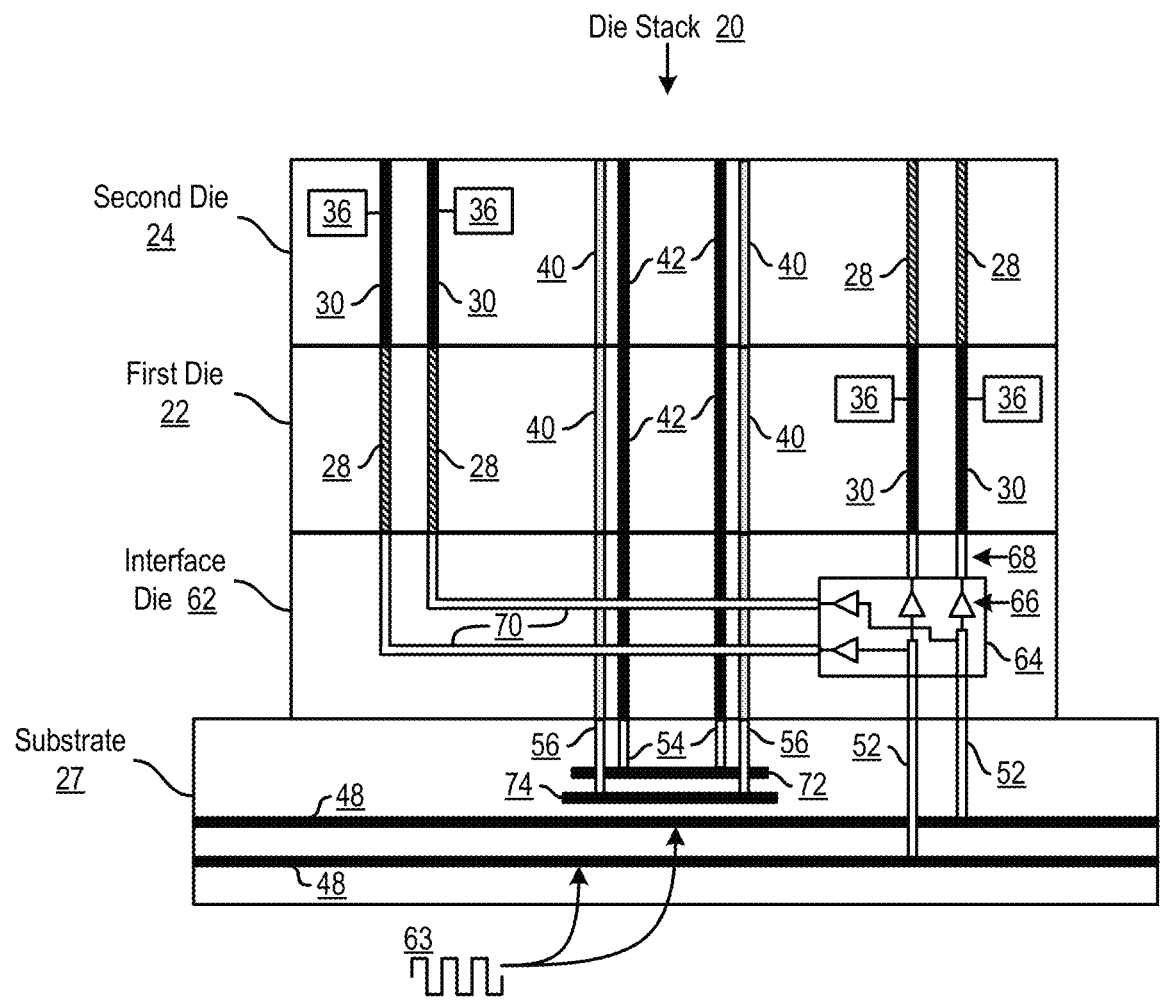
FIGS. 7 and 8 set forth cross-sectional vertical view schematic drawings of further example integrated circuit die stacks according to embodiments of the present invention, where the die stacks include an interface die.

FIG. 7 sets forth a cross-sectional vertical view schematic drawing of a further example integrated circuit die stack according to embodiments of the present invention, where the die stack (20) includes an interface die (62). FIG. 7 shows the dies (22, 24) of FIGS. 1-2 stacked upon a substrate (27) similar to the substrate (26) of FIG. 2—with the cross-section of FIG. 7 taken along lines (90) on FIG. 1 and viewed from perspective (92) on FIG. 1. The example die stack of FIG. 7, however, unlike the die stack of FIG. 2, includes an additional die, an interface die (62) mounted upon the substrate (27) between the substrate (27) and the first die (22).

The interface die (62) provides an interface between the other dies (22, 24) in the stack in the sense that the interface die splits and connects a same set of signal lines (48) from the substrate to the PTVs (28) on the first die and separately to TSVs (30) on the first die (22). The PTVs (28) on the first die (22) then convey signals from the substrate through TSVs (30) of the second die (24) to circuitry on the second die (24). The splitting of signals in the interface die (62) is effected by interface circuitry (64) in the interface die (62). The interface circuitry includes drivers (66) that connect the signal lines (48) from the substrate to signal lines (68, 70) in the interface die. The drivers (66) are depicted pointing up through the stack in a unidirectional manner, but readers will recognize that the interface circuitry (64) can be configured to operate the conductors (52, 68, 70) either unidirectionally or bidirectionally. The signal lines (68) connect driver outputs to TSVs (30) in the first die (22), and the signal lines (70) connect driver outputs to PTVs (28) in the first die (22) and therefore to TSVs (30) in the second die (24) and to circuitry (30) in the second die (24).

In view of this explanation of the example die stack of FIG. 7, readers will recognize that the signal lines (48) of substrate (27) of FIG. 7, with the inclusion of the interface circuitry of the interface die in the die stack, need to drive only a single bus connection (52) into the die stack, an advantage over the design of the substrate of FIG. 2 in which the signal lines (48) were required to drive two sets of bus lines into the die stack, one set of bus lines (50) into the PTVs (28) of the first die (22) and another set of bus lines (52) into the TSVs (30) of the first die (22). Readers will recognize also that, although for ease of explanation this example with an interface die is illustrated upon dies like those of FIG. 1 having rotational symmetry at 180 degrees, interface dies can be configured for any angle of rotational symmetry, 180 degrees, 90 degrees, 60 degrees, and so on.

Figure 8:
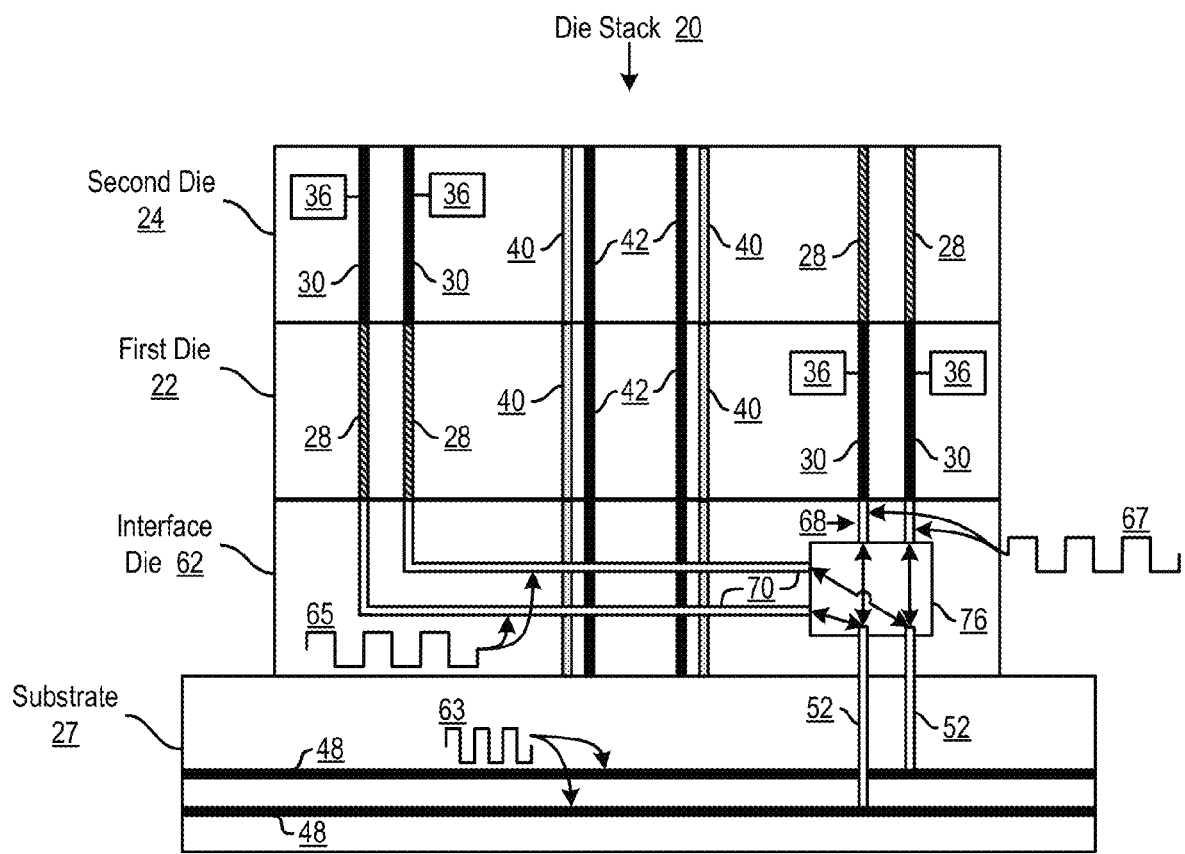

FIG. 8 sets forth a cross-sectional vertical view schematic drawing of a further example integrated circuit die stack according to embodiments of the present invention, where the die stack (20) includes an interface die (62). FIG. 8 shows the dies (22, 24) of FIGS. 1-2 stacked upon a substrate (27) similar to the substrate (26) of FIG. 2—with the cross-section of FIG. 8 taken along lines (90) on FIG. 1 and viewed from perspective (92) on FIG. 1. The example die stack of FIG. 8, however, unlike the die stack of FIG. 2, includes an additional die, an interface die (62) mounted upon the substrate (27) between the substrate (27) and the first die (22).

The interface die (62) provides an interface between the other dies (22, 24) in the stack in the sense that the interface die multiplexes and demultiplexes the same set of signal lines (48) from the substrate (27) to the PTVs (28) on the first die (22) and separately to TSVs (30) on the first die (22). The PTVs (28) on the first die (22) then convey signals from the substrate through TSVs (30) of the second die (24) to circuitry on the second die (24). The multiplexing and demultiplexing of signals in the interface die (62) is carried out by mux/demux circuitry (76) in the interface die (62). The mux/demux circuitry (76) connects the signal lines (48) from the substrate to signal lines (68, 70) in the interface die. The signal lines (68) connect driver outputs to TSVs (30) in the first die (22), and the signal lines (70) connect driver outputs to PTVs (28) in the first die (22) and therefore to TSVs (30) in the second die (24) and to circuitry (30) in the second die (24).

Alternating current signals on the signal lines (48, 52, 68, 70) are typically characterized by a clock speed. The interface die can optionally operate the signal lines (68, 70) to the PTVs (28) and the TSVs (30) in the first die (22) at the same clock speed as the signal lines in the substrate—although such a design would potentially leave the dies operating with unused data communications bandwidth. As a possibly preferred alternative, therefore, the substrate can be configured to operate the signal lines (68, 70) on the substrate at a first clock speed (65, 67) with the interface die (27) operating signal lines (68, 70) to the PTVs (28) and to the TSVs (30) at a second clock speed (63), the first clock speed sufficiently faster than the second clock speed to fit onto the signal lines of the interface die all communications between the substrate and the PTVs and the TSVs. Such a configuration is illustrated here with a signal (63) on signal lines (48) with a clock speed that is twice as fast as the clock speed of the signals (65, 67) on interface die signal lines (68, 70). In a case where, for example, the clock speed of the signal lines (48) in the substrate (27) were 2 GHz and the clock speed of the signals on the signal lines (68, 70) in the interface die (62) were 1 GHz and the mux/demux circuitry (76) administers packets of data from the substrate, sending half the packets to one identical die for processing and the other half to the other die, then with these two example clock speeds, data communications from the substrate to the dies would exactly fit the bandwidth of the data communications speed available in the interface die, thereby reducing or eliminating completely any need for additional storage buffering in the mux/demux circuitry (76) or elsewhere in the interface die (62)—and also reducing or elimating any need for additional signal or bus lines in the substrate.

Figure 9:
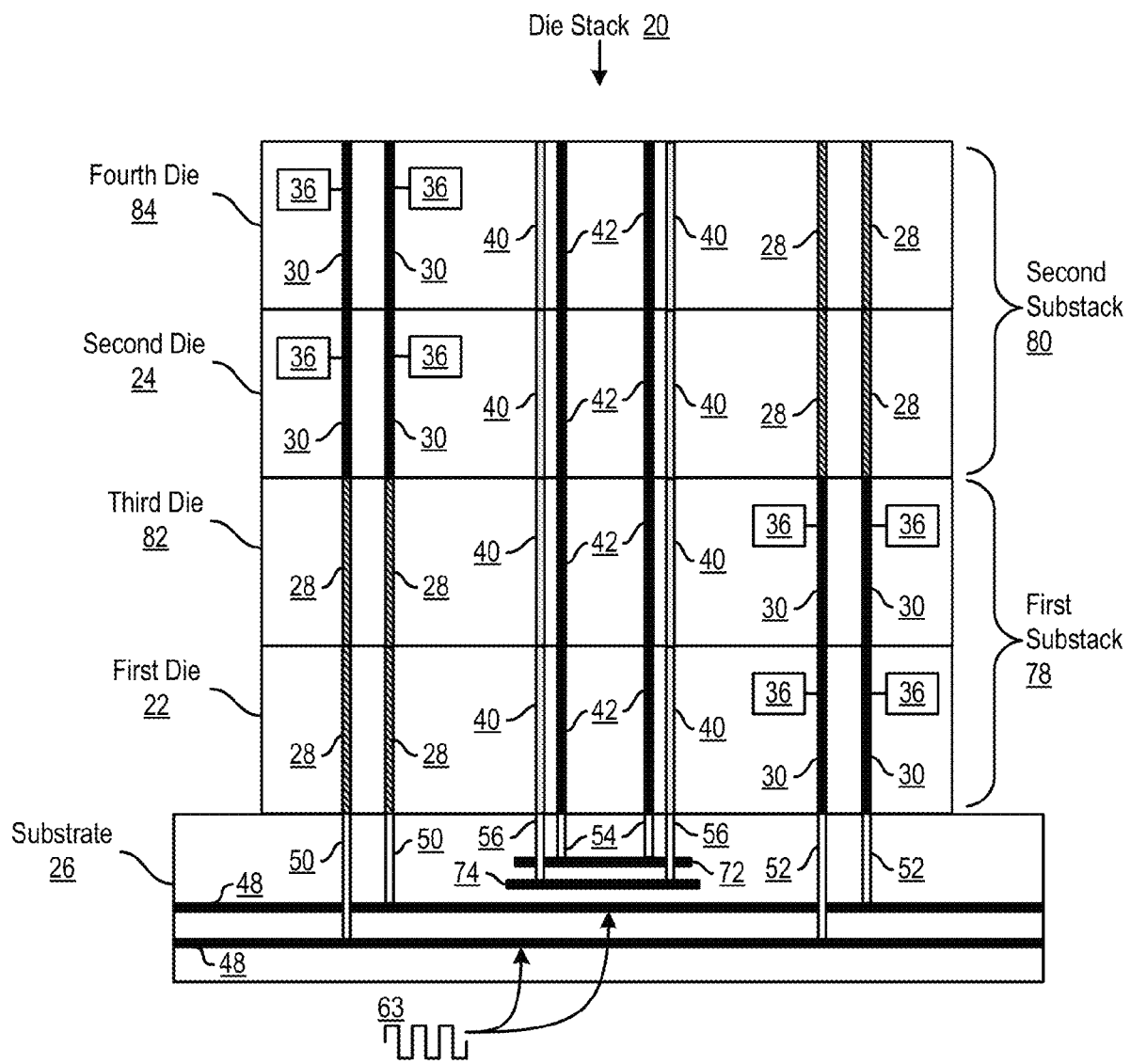
FIGS. 9 and 10 set forth cross-sectional vertical view schematic drawings of further example integrated circuit die stacks according to embodiments of the present invention, where the die stacks include substacks.

For further explanation, FIG. 9 sets forth a cross-sectional vertical view schematic drawing of a further example integrated circuit die stack according to embodiments of the present invention, where the die stack (20) includes substacks (78, 80). FIG. 9 shows dies like the dies (22, 24) of FIG. 1 stacked upon a substrate (26) like the substrate (26) of FIG. 2—with the cross-section of FIG. 9 taken along lines (90) on FIG. 1 and viewed from perspective (92) on FIG. 1. The example die stack of FIG. 9, however, unlike the die stack of FIG. 2, includes a first substack (78) mounted upon the substrate (26), where the first substack includes two or more (in this example, only two) identical dies (22, 82), and each of the dies (22, 82) in the first substack (78) are stacked upon one another without rotation with respect to one another. The views from perspective (92) of the cross section along line (90) on FIG. 1, therefore, in the illustration of FIG. 9 appears exactly identical, with PTVs (28) on the left, power and common lines (40, 42) in the center, and TSVs (30) on the right.

The example die stack (20) of FIG. 9 also includes a second substack (80) that includes two or more dies (in this example, exactly two) (24, 84) identical to the dies (22, 82) in the first substack (78). The dies (24, 84) in the second substack (80) are stacked upon one another without rotation with respect to one another, although the entire second substack is rotated with respect to the first substack and mounted upon the first substack so that PTVs (28) in the first substack connect the signal lines (48, 50, 52) from the substrate (26) through the first substack (78) to TSVs (30) in the second substack (80), where the TSVs (30) in the second substack (80) drive active circuitry (36) in the dies (24, 84) of the second substack (80). The rotation of the second substack in this example is 180 degrees with respect to the first substack, a fact that is evidenced by reversal of the positions of the TSVs (30) and the PTVs (28) in the cross-sectional view of the second substack (80) with respect to the positions of the TSVs (30) and the PTVs (28) in the cross-sectional view of the first substack (78). That is, in the second substack (80), the PTVs (28) are on the right and the TSVs (30) are on the left.

Figure 10:
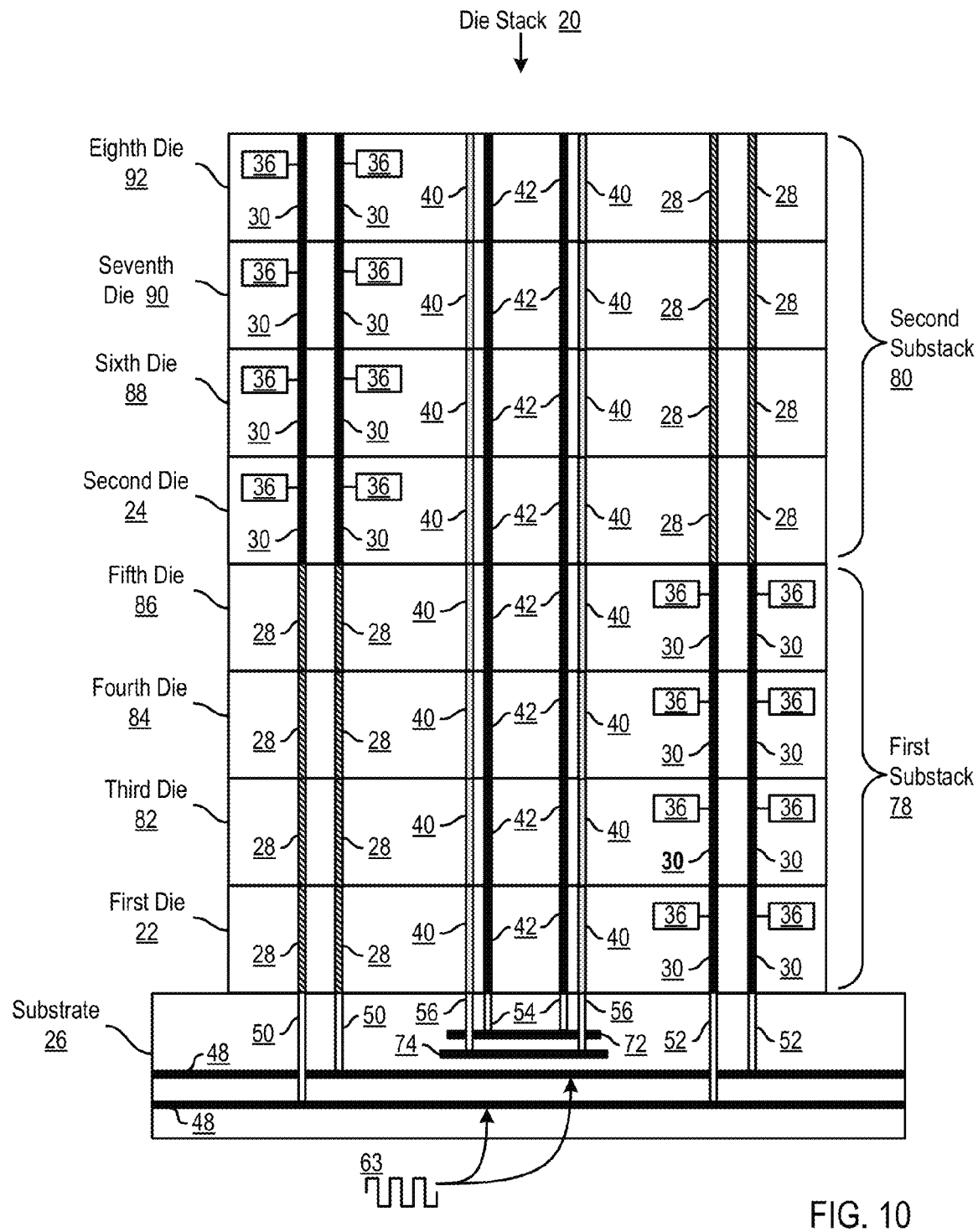

For further explanation, FIG. 10 sets forth a cross-sectional vertical view schematic drawing of a further example integrated circuit die stack according to embodiments of the present invention, where the die stack (20) includes substacks (78, 80). FIG. 10 shows dies like the dies (22, 24) of FIG. 1 stacked upon a substrate (26) like the substrate (26) of FIG. 2—with the cross-section of FIG. 10 taken along lines (90) on FIG. 1 and viewed from perspective (92) on FIG. 1. The example die stack of FIG. 10, however, unlike the die stack of FIG. 2, includes a first substack (78) mounted upon the substrate (26), where the first substack includes two or more (in this example, four) identical dies (22, 82, 84, 86), and each of the dies (22, 82, 84, 86) in the first substack (78) are stacked upon one another without rotation with respect to one another. The cross-sectional views of the dies (22, 82, 84, 86) in the first substack (78) on FIG. 1, therefore, appear exactly identical, with PTVs (28) on the left, power and common lines (40, 42) in the center, and, on the right, TSVs (30) connected to active circuitry.

The example die stack (20) of FIG. 10 also includes a second substack (80) that includes two or more dies (in this example, four) (24, 88, 90, 92) identical to the dies (22, 82, 84, 86) in the first substack (78). The dies (24, 88, 90, 92) in the second substack (80) are stacked upon one another without rotation with respect to one another, although the entire second substack (80) is rotated with respect to the first substack (78) and then mounted upon the first substack so that PTVs (28) in the first substack connect the signal lines (48, 50, 52) from the substrate (26) through the first substack (78) to TSVs (30) in the second substack (80), where the TSVs (30) in the second substack (80) drive active circuitry (36) in the dies (24, 88, 90, 92) of the second substack (80). The rotation of the second substack in this example is 180 degrees with respect to the first substack, a fact that is evidenced by reversal of the positions of the TSVs (30) and the PTVs (28) in the cross-sectional view of the second substack (80) with respect to the positions of the TSVs (30) and the PTVs (28) in the cross-sectional view of the first substack (78). That is, in the second substack (80), the PTVs (28) are on the right and the TSVs (30) are on the left.

Figure 11:
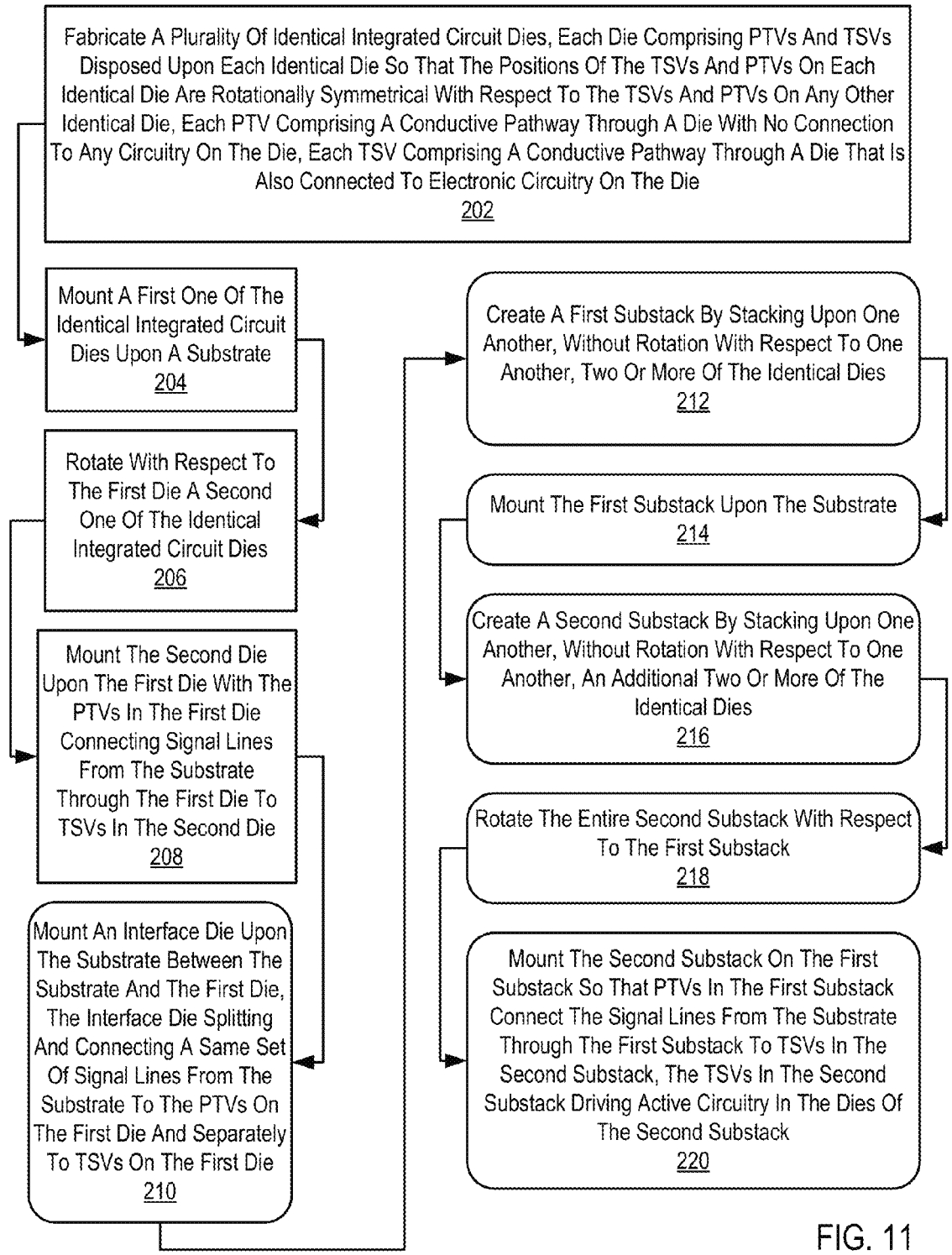
FIG. 11 sets forth a flow chart illustrating an example method of manufacturing an integrated circuit die stack according to embodiments of the present invention.

For further explanation, FIG. 11 sets forth a flow chart illustrating an example method of manufacturing an integrated circuit die stack according to embodiments of the present invention. The method of FIG. 11 fabricates integrated circuit die stacks like those described above with regard to FIGS. 1-10. For ease of explanation, therefore, the method of FIG. 11 is described here with reference to FIGS. 1-10 as well as FIG. 11, so that reference numbers in the discussion below are found not only on FIG. 11, but also on FIGS. 1-10.

The method of FIG. 11 includes fabricating (202) a plurality of identical integrated circuit dies (22, 24), each die including PTVs (28) and TSVs (30) disposed upon each identical die so that the positions of the TSVs and PTVs on each identical die are rotationally symmetrical with respect to the TSVs and PTVs on any other identical die. The positions of the TSVs and PTVs are rotationally symmetrical in the sense that the positions of the TSVs and PTVs on each identical die align when one die is rotated in a same plane with respect to any other identical die. Angles of rotation for rotational symmetry can be 180 degrees, 90 degrees, 60 degrees, and so on as may occur to those of skill in the art. The method of FIG. 11 also includes mounting (204) a first one of the identical integrated circuit dies (22) upon a substrate (26), rotating (206) with respect to the first die a second one of the identical integrated circuit dies (24), and mounting (208) the second die (24) upon the first die (22) with the PTVs (28) in the first die connecting signal lines (48) from the substrate (26) through the first die (22) to TSVs (30) in the second die (24).

The method of FIG. 11 also includes mounting (210) an interface die (62 on FIG. 7) upon the substrate (27 on FIGS. 7-8) between the substrate and the first die (22), with the interface die (62) splitting and connecting a same set of signal lines (48) from the substrate (27) to the PTVs (28) on the first die (22) and separately to TSVs (30) on the first die (22). As an alternative to a direct split of the signal lines, reference (64) on FIG. 7, the interface die can be configured to multiplex and demultiplex, reference (76) on FIG. 8, signal lines (48) from the substrate (27) to the PTVs (28) on the first die (22) and separately to TSVs (30) on the first die (22), with the signal lines on the substrate (48), to the PTVs (70), and to the TSVs (68) all operating at a same clock speed. As a further alternative, the interface die (62 on FIG. 8) can be configured to multiplex and demultiplex, reference (76) on FIG. 8, signal lines (48) from the substrate with the signal lines (48) on the substrate operating at a first clock speed (63) and the interface die operating the signal lines to the PTVs (70) and to the TSVs (68) at a second clock speed (65, 57 on FIG. 8), with the first clock speed sufficiently faster than the second clock speed to fit onto the signal lines (68, 70) of the interface die all communications between the substrate and the PTVs and the TSVs. Mounting (210) an interface die between the substrate and the first die in the die stack is depicted as an optional step in the flow chart of FIG. 11, because die stacks according to embodiments of the present invention may be fabricated with or without interface dies.

The method of FIG. 11 also includes creating (212) a first substack (78 on FIGS. 9-10) by stacking upon one another, without rotation with respect to one another, two or more of the identical dies (22, 82), and mounting (214) the first substack (78) upon the substrate (26). The method of FIG. 11 also includes creating (216) a second substack (80) by stacking upon one another, without rotation with respect to one another, an additional two or more of the identical dies (24, 88, 90, 92 on FIG. 10), and rotating (218) the entire second substack with respect to the first substack. The positions of the PTVs, TSVs, power lines, and common lines on all the identical dies are rotationally symmetric with one another, and operable angles of rotation for symmetry include 180 degrees, 90 degrees, 60 degrees, and so on. The method of FIG. 11 also includes mounting (220) the second substack (80) on the first substack (78) so that PTVs (28) in the first substack connect the signal lines (48) from the substrate (26) through the first substack (78) to TSVs (30) in the second substack (80), where the TSVs (30) in the second substack drive active circuitry (36) in the dies (24, 88, 90, 92 on FIG. 10) of the second substack (80). Steps (212, 214, 216, 218, 220) are depicted in the flow chart of FIG. 11 as optional because die stacks according to embodiments of the present invention may be implemented with or without substacks. A die stack containing only two identical dies rotated with respect to one another, as in the die stacks of FIGS. 2, 7, and 8, contains no substacks—it being taken as trivial here to speak of a 'substack' as containing only one die. That is, a 'substack' as the term is used here contains at least two dies, not rotated with respect to one another.

Figure 12:
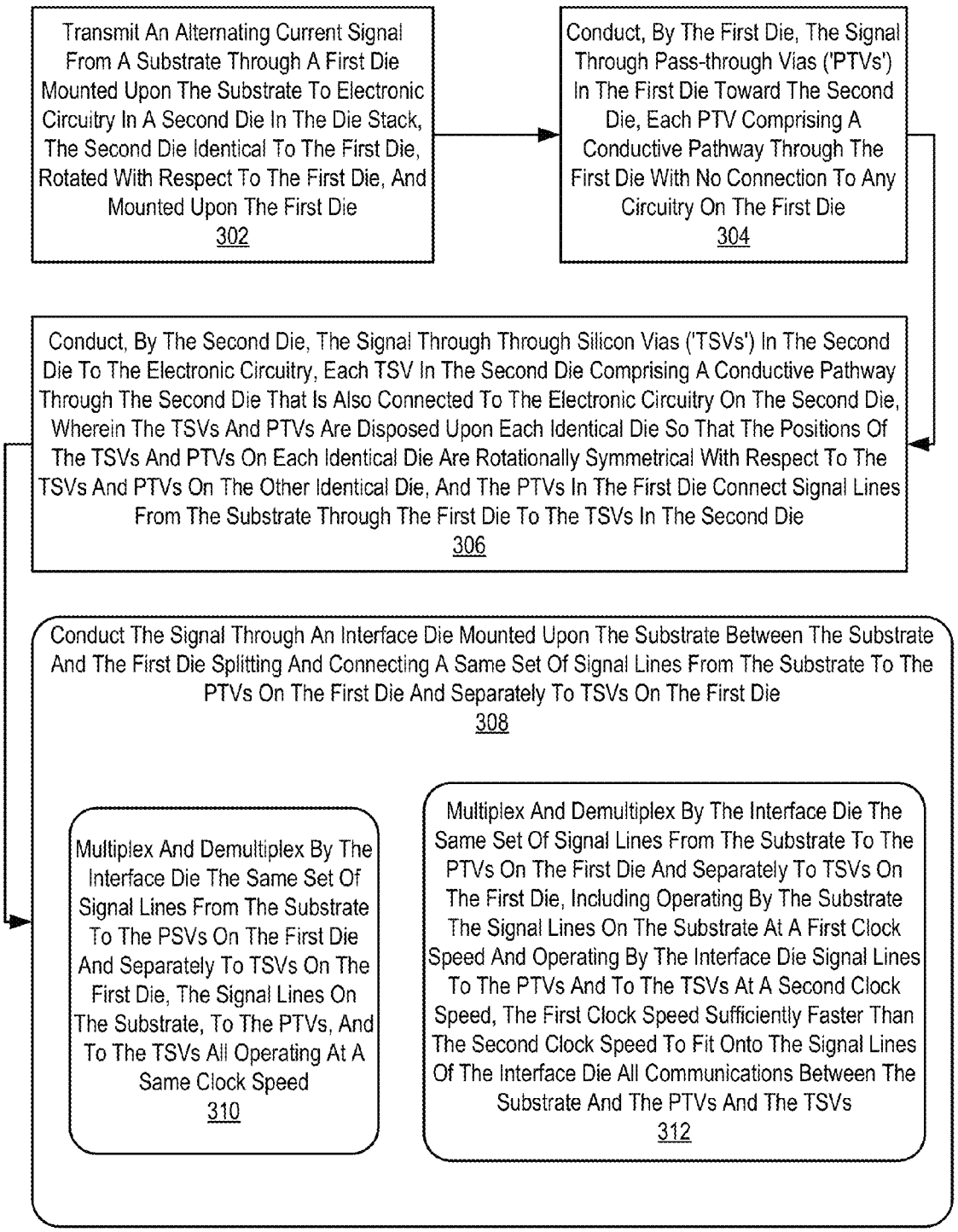

For further explanation, FIG. 12 sets forth a flow chart illustrating an example method of operation for an integrated circuit die stack (20) according to embodiments of the present invention. The method of FIG. 12 operates integrated circuit die stacks like those described above with regard to FIGS. 1-10. For ease of explanation, therefore, the method of FIG. 11 is described here with reference to FIGS. 1-10 as well as FIG. 12, so that reference numbers in the discussion below are found not only on FIG. 12, but also on FIGS. 1-10.

With reference also to FIGS. 1-2: The method of FIG. 12 includes transmitting (302) an alternating current signal (63) from a substrate (26) through a first die (22) mounted upon the substrate to electronic circuitry (36) in a second die (24) in the die stack (20), where the second die is identical to the first die, rotated with respect to the first die, and mounted upon the first die. The method of FIG. 12 also includes conducting (304), by the first die (22), the signal (63) through PTVs (28) in the first die toward the second die, where each PTV is composed of a conductive pathway through the first die with no connection to any circuitry on the first die. The method of FIG. 12 also includes conducting (306), by the second die (24), the signal (63) through TSVs (30) in the second die to the electronic circuitry (36), where each TSV in the second die is composed of a conductive pathway through the second die that is also connected to the electronic circuitry on the second die. The TSVs (30) and PTVs (28) are disposed upon each identical die so that the positions of the TSVs and PTVs on each identical die are rotationally symmetrical with respect to the TSVs and PTVs on the other identical die, and the PTVs (28) in the first die connect signal lines (48) from the substrate (26) through the first die to the TSVs (30) in the second die. The angle of rotational symmetry for the dies in FIGS. 1-2 is 180 degrees. As illustrated and explained above with regard to FIGS. 1-6, however, angles of rotation for rotational symmetry can be 180 degrees, 90 degrees, 60 degrees, and so on as may occur to those of skill in the art.

With reference also to FIG. 7: The method of FIG. 12 also includes conducting (308) the signal (63) through an interface die (62) mounted upon the substrate (27) between the substrate and the first die (22) splitting and connecting a same set of signal lines (48, 68, 70) from the substrate to the PTVs (28) on the first die (22) and separately to TSVs (30) on the first die (22). With reference also to FIG. 8: The method of FIG. 12 also includes the alternative option of multiplexing and demultiplexing (310 on FIG. 12, 76 on FIG. 8) by the interface die (27) the same set of signal lines (48) from the substrate (27) to the PTVs (28) on the first die (22) and separately to TSVs (30) on the first die (22), with the signal lines on the substrate (48), to the PTVs (70), and to the TSVs (68) all operating at a same clock speed. As a further optional alternative, the method of FIG. 12 also includes multiplexing and demultiplexing (312 on FIG. 12, 76 on FIG. 8) by the interface die (27) the same set of signal lines (48) from the substrate (27) to the PTVs (28) on the first die (22) and separately to TSVs (30) on the first die (22), including operating by the substrate (27) the signal lines (48) on the substrate (27) at a first clock speed (63) and operating by the interface die signal lines (68, 70) to the PTVs (28) and to the TSVs (30) at a second clock speed (65, 67), the first clock speed sufficiently faster than the second clock speed to fit onto the signal lines (68, 70) of the interface die (62) all communications between the substrate (27) and the PTVs (28) and the TSVs (30). The steps of conducting (308) the signal through an interface die as well multiplexing and demultiplexing (310, 312) the signal by the interface die are depicted as optional steps in the flow chart of FIG. 12, because die stacks according to embodiments of the present invention may be operated with or without interface dies.

For further explanation, FIG. 13 sets forth a flow chart illustrating a further example method of operation for an integrated circuit die stack according to embodiments of the present invention. The method of FIG. 13 operates integrated circuit die stacks like those described above with regard to FIGS. 1-10. For ease of explanation, therefore, the method of FIG. 11 is described here with reference to FIGS. 1-10 as well as FIG. 13, so that reference numbers in the discussion below are found not only on FIG. 13, but also on FIGS. 1-10. The method of FIG. 13 is similar to the method of FIG. 12, including as it does transmitting (302) an alternating current signal from a substrate, conducting (304) the signal through PTVs, and conducting (306) the signal through TSVs to electronic circuitry.

With reference also to FIGS. 9-10: Transmitting (302) an alternating current signal (63) from a substrate in the method of FIG. 13, however, unlike the method of FIG. 12, includes transmitting (314) the signal (63) through a first substack (78) mounted upon the substrate (26) to electronic circuitry (36) in a second substack (80) in the die stack (20). The first substack (78) includes two or more identical dies (22, 82 on FIG. 9), and each of the dies in the first substack are stacked upon one another without rotation with respect to one another. The second substack (80) includes two or more dies (24, 84 on FIG. 9) identical to the dies in the first substack, also with each of the dies in the second substack stacked upon one another without rotation with respect to one another. The entire second substack (80), however, is rotated with respect to the first substack and mounted upon the first substack so that PTVs (28) in the first substack connect the signal lines (48) from the substrate through the first substack to TSVs (30) in the second substack. The angle of rotational symmetry for the substacks in FIGS. 9-10 is 180 degrees. As illustrated and explained above with regard to FIGS. 1-6, however, angles of rotation for rotational symmetry can be 180 degrees, 90 degrees, 60 degrees, and so on as may occur to those of skill in the art.

Also in the method of FIG. 13, conducting (304) the signal through PTVs includes conducting (316) the signal (63) by the first substack (78) through PTVs (28) in the first substack, where the PTVs are conductive pathways through the first substack with no connection to any circuitry in the first substack. Also in the method of FIG. 13, conducting (306) the signal (63) through TSVs (30) includes conducting (318) the signal by the second substack (80) through TSVs (30) in the second substack to electronic circuitry (36) in the second substack, where the TSVs (30) in the second substack are composed of conductive pathways through the second substack that are also connected to electronic circuitry (36) in the second substack (80).

In view of the explanations set forth above, readers will recognize that the benefits of integrated circuit die stack with rotationally symmetric vias according to embodiments of the present invention include:

Substantial reduction of bus signal lines loads when stacking multiple dies,
Higher signal quality on the vias in the dies of a stack, and
Support for faster bus speeds on the vias in the dies of a stack.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An integrated circuit die stack comprising:
   a first integrated circuit die mounted upon a substrate, the first die comprising pass-through vias ('PTVs'), each PTV comprising a conductive pathway through the first die with no connection to any circuitry on the first die;
   a second integrated circuit die, identical to the first die, rotated with respect to the first die and mounted upon the first die, with the PTVs in the first die connecting signal lines from the substrate through the first die to through silicon vias ('TSVs') in the second die, each TSV on the second die comprising a conductive pathway through the second die that is also connected to electronic circuitry on the second die;

a first substack mounted upon the substrate, the first substack comprising two or more identical dies, each of the dies in the first substack stacked upon one another without rotation with respect to one another; and a second substack comprising two or more dies identical to the dies in the first substack, each of the dies in the second substack stacked upon one another without rotation with respect to one another, the entire second substack rotated with respect to the first substack and mounted upon the first substack so that PTVs in the first substack connect the signal lines from the substrate through the first substack to TSVs in the second substack, the TSVs in the second substack driving active circuitry in the dies of the second substack;

the TSVs and PTVs disposed upon each identical die so that the positions of the TSVs and PTVs on each identical die are rotationally symmetrical with respect to the TSVs and PTVs on the other identical die.

2. The die stack of claim 1 further comprising:
an interface die mounted upon the substrate between the substrate and the first die splitting and connecting a same set of signal lines from the substrate to the PTVs on the first die and separately to TSVs on the first die; and the interface die multiplexing and demultiplexing the same set of signal lines from the substrate to the PTVs on the first die and separately to TSVs on the first die, the signal lines on the substrate, to the PTVs, and to the TSVs all operating at a same clock speed.

3. The die stack of claim 1 further comprising:
an interface die mounted upon the substrate between the substrate and the first die splitting and connecting a same set of signal lines from the substrate to the PTVs on the first die and separately to TSVs on the first die; and the interface die multiplexing and demultiplexing a same set of signal lines from the substrate to the PTVs on the first die and separately to TSVs on the first die, the substrate operating the signal lines on the substrate at a first clock speed and the interface die operating signal lines to the PTVs and to the TSVs at a second clock speed, the first clock speed sufficiently faster than the second clock speed to fit onto the signal lines of the interface die all communications between the substrate and the PTVs and the TSVs.

4. The die stack of claim 1 wherein the TSVs and PTVs disposed upon each identical die so that the positions of the TSVs and PTVs on each identical die are rotationally symmetrical with respect to the TSVs and PTVs on the other identical die further comprises:
the TSVs and PTVs disposed upon each identical die so that the positions of the TSVs and PTVs on each identical die align when one die is rotated 180 degrees in a same plane with respect to any other identical die.

5. The die stack of claim 1 wherein the TSVs and PTVs disposed upon each identical die so that the positions of the TSVs and PTVs on each identical die are rotationally symmetrical with respect to the TSVs and PTVs on the other identical die further comprises:
the TSVs and PTVs disposed upon each identical die so that TSVs align with PTVs when one die is rotated 90 degrees in a same plane with respect to any other identical die.

6. The die stack of claim 1 wherein the TSVs and PTVs disposed upon each identical die so that the positions of the TSVs and PTVs on each identical die are rotationally symmetrical with respect to the TSVs and PTVs on the other identical die further comprises:
the TSVs and PTVs disposed upon each identical die so that TSVs align with PTVs when one die is rotated 60 degrees in a same plane with respect to any other identical die.

7. A method of manufacturing an integrated circuit die stack comprising:
fabricating a plurality of identical integrated circuit dies, each die comprising pass-through-vias ('PTVs') and through-silicon-vias ('TSVs') disposed upon each identical die so that the positions of the TSVs and PTVs on each identical die are rotationally symmetrical with respect to the TSVs and PTVs on any other identical die, each PTV comprising a conductive pathway through a die with no connection to any circuitry on the die, each TSV comprising a conductive pathway through a die that is also connected to electronic circuitry on the die;

mounting a first one of the identical integrated circuit dies upon a substrate;

rotating with respect to the first die a second one of the identical integrated circuit dies;

mounting the second die upon the first die with the PTVs in the first die connecting signal lines from the substrate through the first die to TSVs in the second die; and creating a first substack by stacking upon one another, without rotation with respect to one another, two or more of the identical dies;

mounting the first substack upon the substrate;

creating a second substack by stacking upon one another, without rotation with respect to one another, an additional two or more of the identical dies;

rotating the entire second substack with respect to the first substack; and mounting the second substack on the first substack so that PTVs in the first substack connect the signal lines from the substrate through the first substack to TSVs in the second substack, the TSVs in the second substack driving active circuitry in the dies of the second substack.

8. The method of claim 7 further comprising:
mounting an interface die upon the substrate between the substrate and the first die, the interface die multiplexing and demultiplexing a same set of signal lines from the substrate to the PTVs on the first die and separately to TSVs on the first die, the signal lines on the substrate, to the PTVs, and to the TSVs all operating at a same clock speed.

9. The method of claim 7 further comprising:
mounting an interface die upon the substrate between the substrate and the first die, the interface die multiplexing and demultiplexing a same set of signal lines from the substrate to the PTVs on the first die and separately to TSVs on the first die, the substrate operating the signal lines on the substrate at a first clock speed and the interface die operating the signal lines to the PTVs and to the TSVs at a second clock speed, the first clock speed sufficiently faster than the second clock speed to fit onto the signal lines of the interface die all communications between the substrate and the PTVs and the TSVs.

10. The method of claim 7 wherein the TSVs and PTVs disposed upon each identical die so that the positions of the TSVs and PTVs on each identical die are rotationally symmetrical with respect to the TSVs and PTVs on any other identical die further comprises:

the TSVs and PTVs disposed upon each identical die so that the positions of the TSVs and PTVs on each identical die align when one die is rotated 180 degrees in a same plane with respect to any other identical die.

11. The method of claim 7 wherein the TSVs and PTVs disposed upon each identical die so that the positions of the TSVs and PTVs on each identical die are rotationally symmetrical with respect to the TSVs and PTVs on any other identical die further comprises:
the TSVs and PTVs disposed upon each identical die so that TSVs align with PTVs when one die is rotated 90 degrees in a same plane with respect to any other identical die.

12. The method of claim 7 wherein the TSVs and PTVs disposed upon each identical die so that the positions of the TSVs and PTVs on each identical die are rotationally symmetrical with respect to the TSVs and PTVs on any other identical die further comprises:
the TSVs and PTVs disposed upon each identical die so that TSVs align with PTVs when one die is rotated 60 degrees in a same plane with respect to any other identical die.

13. A method of operation for an integrated circuit die stack comprising:
transmitting an alternating current signal from a substrate through a first die mounted upon the substrate to electronic circuitry in a second die in the die stack, the second die identical to the first die, rotated with respect to the first die, and mounted upon the first die;
conducting, by the first die, the signal through pass-through vias ('PTVs') in the first die toward the second die, each PTV comprising a conductive pathway through the first die with no connection to any circuitry on the first die; and
conducting, by the second die, the signal through through silicon vias ('TSVs') in the second die to the electronic circuitry, each TSV in the second die comprising a conductive pathway through the second die that is also connected to the electronic circuitry on the second die, wherein the TSVs and PTVs are disposed upon each identical die so that the positions of the TSVs and PTVs on each identical die are rotationally symmetrical with respect to the TSVs and PTVs on the other identical die, and the PTVs in the first die connect signal lines from the substrate through the first die to the TSVs in the second die, wherein:
transmitting an alternating current signal from a substrate further comprises transmitting the signal through a first substack mounted upon the substrate to electronic circuitry in a second substack in the die stack, the first substack comprising two or more identical dies, each of the dies in the first substack stacked upon one another without rotation with respect to one another, the second substack comprising two or more dies identical to the dies in the first substack, each of the dies in the second substack stacked upon one another without rotation with respect to one another, the entire second substack rotated with respect to the first substack and mounted upon the first substack so that PTVs in the first substack connect the signal lines from the substrate through the first substack to TSVs in the second substack;
conducting the signal through PTVs further comprises conducting the signal by the first substack through PTVs in the first substack, the PTVs comprising conductive pathways through the first substack with no connection to any circuitry in the first substack; and
conducting the signal through TSVs further comprises conducting the signal by the second substack through TSVs in the second substack to electronic circuitry in the second substack, TSVs in the second substack comprising conductive pathways through the second substack that are also connected to electronic circuitry in the second substack.

14. The method of claim 13 further comprising:
conducting the signal through an interface die mounted upon the substrate between the substrate and the first die splitting and connecting a same set of signal lines from the substrate to the PTVs on the first die and separately to TSVs on the first die; and
multiplexing and demultiplexing by the interface die the same set of signal lines from the substrate to the PTVs on the first die and separately to TSVs on the first die, the signal lines on the substrate, to the PTVs, and to the TSVs all operating at a same clock speed.

15. The method of claim 13 further comprising:
conducting the signal through an interface die mounted upon the substrate between the substrate and the first die splitting and connecting a same set of signal lines from the substrate to the PTVs on the first die and separately to TSVs on the first die; and
multiplexing and demultiplexing by the interface die the same set of signal lines from the substrate to the PTVs on the first die and separately to TSVs on the first die, including operating by the substrate the signal lines on the substrate at a first clock speed and operating by the interface die signal lines to the PTVs and to the TSVs at a second clock speed, the first clock speed sufficiently faster than the second clock speed to fit onto the signal lines of the interface die all communications between the substrate and the PTVs and the TSVs.

16. The method of claim 13 wherein the TSVs and PTVs disposed upon each identical die so that the positions of the TSVs and PTVs on each identical die are rotationally symmetrical with respect to the TSVs and PTVs on the other identical die further comprises:
the TSVs and PTVs disposed upon each identical die so that the positions of the TSVs and PTVs on each identical die align when one die is rotated 180 degrees in a same plane with respect to any other identical die.

17. The method of claim 13 wherein the TSVs and PTVs disposed upon each identical die so that the positions of the TSVs and PTVs on each identical die are rotationally symmetrical with respect to the TSVs and PTVs on the other identical die further comprises:
the TSVs and PTVs disposed upon each identical die so that the positions of the TSVs and PTVs on each identical die align when one die is rotated 90 degrees in a same plane with respect to any other identical die.

18. The method of claim 13 wherein the TSVs and PTVs disposed upon each identical die so that the positions of the TSVs and PTVs on each identical die are rotationally symmetrical with respect to the TSVs and PTVs on the other identical die further comprises:
the TSVs and PTVs disposed upon each identical die so that the positions of the TSVs and PTVs on each identical die align when one die is rotated 60 degrees in a same plane with respect to any other identical die.

* * * * *